(12) United States Patent
Leroux

(10) Patent No.: US 6,258,611 B1
(45) Date of Patent: Jul. 10, 2001

(54) METHOD FOR DETERMINING TRANSLATION PORTION OF MISALIGNMENT ERROR IN A STEPPER

(75) Inventor: Pierre Leroux, San Antonio, TX (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/422,912

(22) Filed: Oct. 21, 1999

(51) Int. Cl.[7] .................................................. H01L 21/66
(52) U.S. Cl. .............................. 438/14; 438/16; 438/401; 430/312; 430/394; 430/396
(58) Field of Search ....................... 438/14, 16; 430/312; 437/51

(56) References Cited

U.S. PATENT DOCUMENTS

| | | | |
|---|---|---|---|
| 5,350,704 | * | 9/1994 | Anderson et al. ..................... 437/51 |
| 5,365,072 | * | 11/1994 | Turner et al. ..................... 250/491.1 |
| 5,602,619 | * | 2/1997 | Sogard ..................... 355/53 |
| 5,898,227 | * | 4/1999 | Geffken et al. ..................... 257/797 |
| 5,933,760 | * | 8/1999 | Iyer et al. ..................... 438/778 |
| 5,943,588 | * | 8/1999 | Watrobski et al. ..................... 438/401 |
| 5,972,567 | * | 10/1999 | Hu ..................... 430/312 |
| 6,080,659 | * | 6/2000 | Chen et al. ..................... 438/633 |

* cited by examiner

Primary Examiner—John F. Niebling
Assistant Examiner—Olivia Luk
(74) Attorney, Agent, or Firm—Wagner, Murabito & Hao LLP

(57) ABSTRACT

A method for determining translation portion of misalignment error in a stepper. In one embodiment, the method comprises a series of steps in a stepper, starting with the step of receiving a wafer in the stepper. In another step a first pattern, including an error-free fine alignment target, is created on the wafer. Next, the wafer is realigned in the stepper using the error-free fine alignment target. Then a second pattern is created on the wafer overlaying said first pattern. In another step, the translational error between the first pattern and the second pattern is measured.

12 Claims, 12 Drawing Sheets

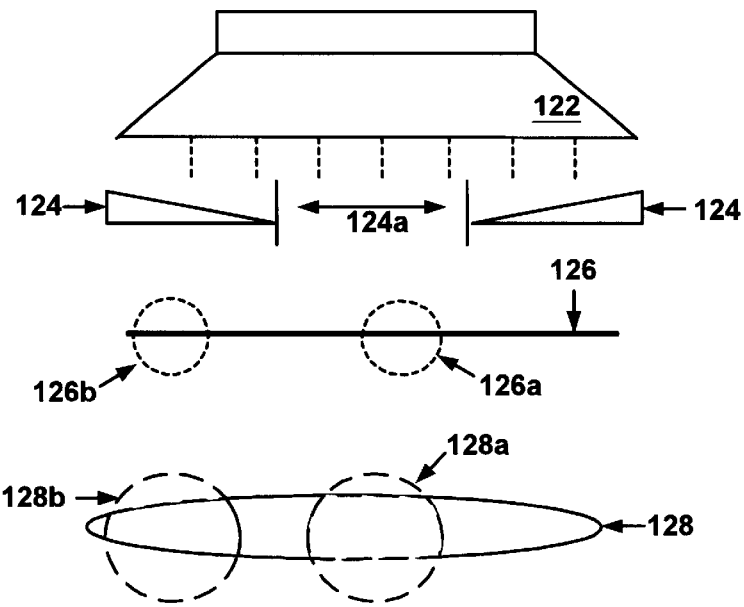
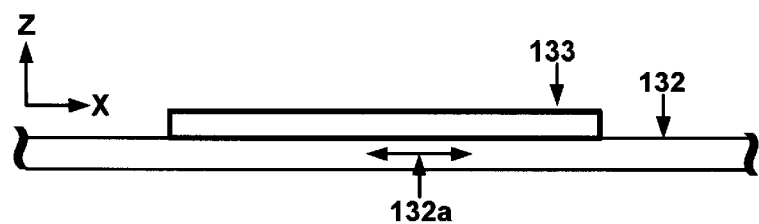
PRIOR ART FIG. 1A

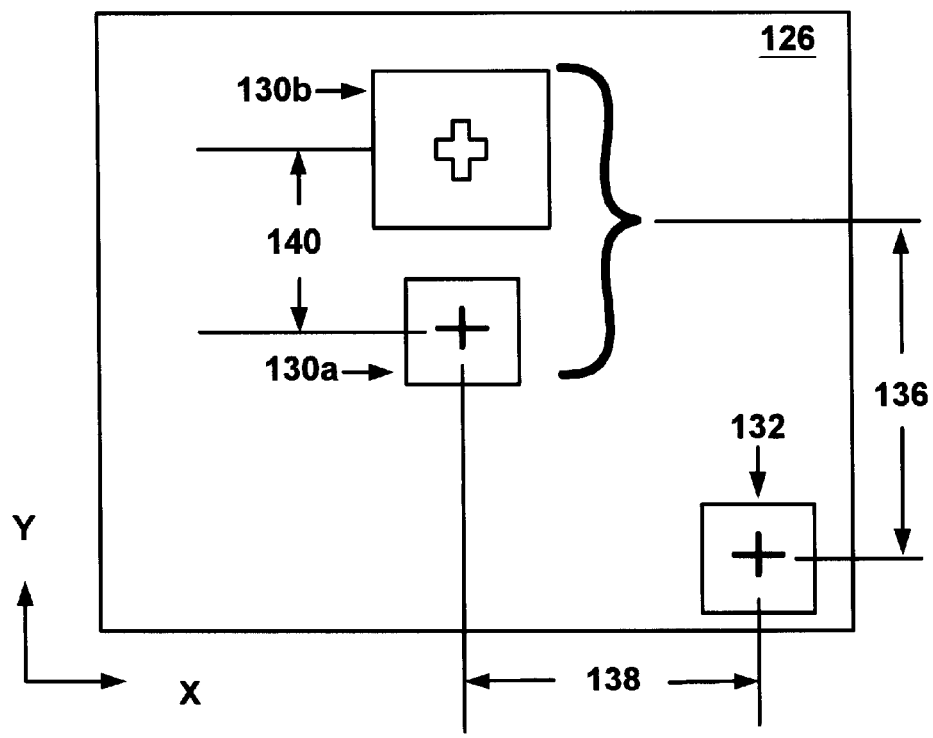
PRIOR ART FIG. 1B

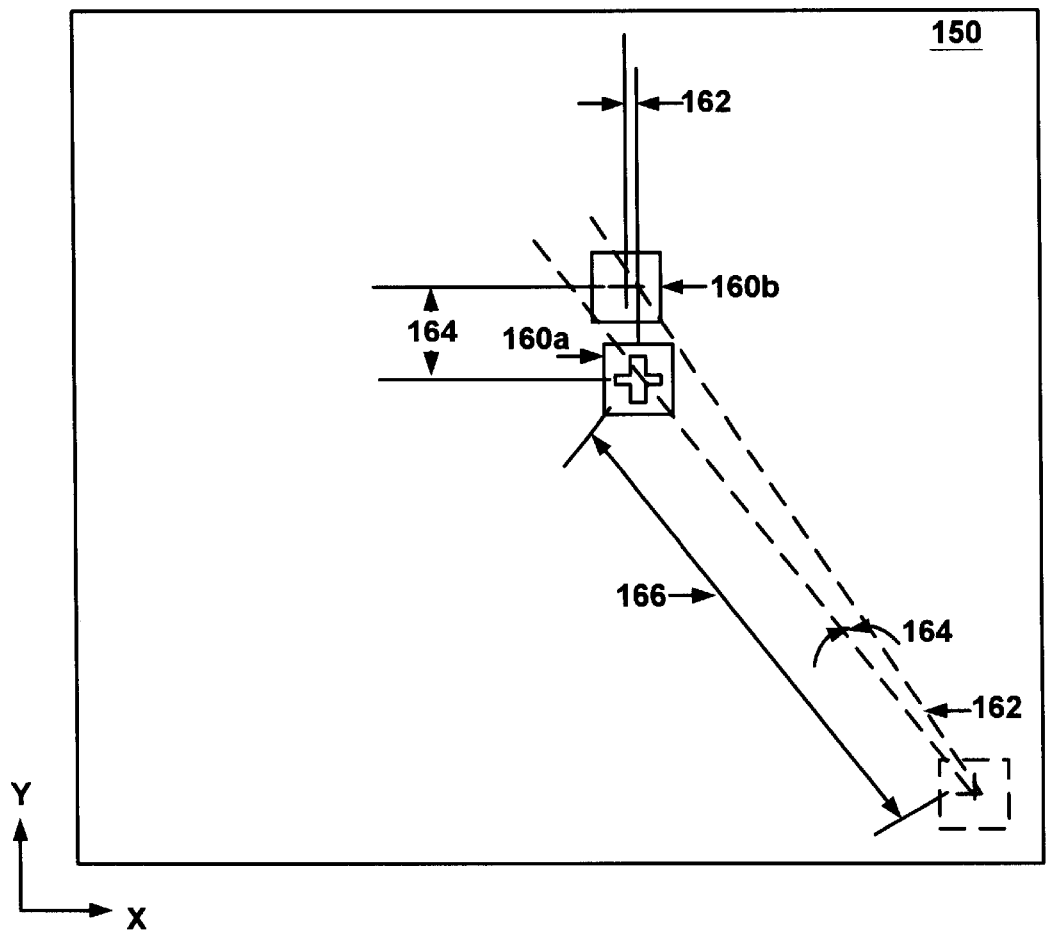
PRIOR ART FIG. 1C

METHOD FOR DETERMINING TRANSLATION PORTION OF MISALIGNMENT ERROR IN A STEPPER

TECHNICAL FIELD

The present claimed invention relates to the field of semiconductor wafer fabrication. More specifically, the present claimed invention relates to a method for determining the translation portion of misalignment error in a stepper used to fabricate patterned layers on a wafer.

BACKGROUND ART

Integrated circuits (ICs) are fabricated en masse on silicon wafers using well-known photolithography, etching, deposition, and polishing techniques. These techniques are used to define the size and shape of components and interconnects within a given layer of material built on a wafer. The IC is essentially built-up using a multitude of interconnecting layers, one formed on top of another. Because the layers interconnect, a need arises for ensuring that the patterns on adjacent layers of the wafer are accurately formed.

Referring now to prior art FIG. 1A, a side view of a stepper is shown. A stepper 100a includes a light source 122, masking blades 124, a reticle 126, a lens 128, and a stage 132. The light source 122 projects light through an opening 126a of masking blades 124, through the transparent portion of a pattern on a reticle 126A, through lens 128 and onto a wafer 133, located on the stage 132. By doing so, the pattern of the reticle 126 is reproduced on the wafer 133, typically at a 5:1 reduction. A pattern located on an inner, or center, portion 126a of the reticle 126, passes through a center portion 128a of lens 128. Similarly, a pattern located on an outer, or peripheral, portion 126b of the reticle 126, passes through an outer portion 128b of lens 128.

Accurate formation of an image on a wafer using photolithography depends on several error-causing variables. These variables include rotational alignment error, translational alignment error, lens distortion error, and reticle writing error, among others. One of the most important variables for accurate formation of an image on a wafer is translational alignment error, or translational misalignment. The alignment error, arises between the reticle image, projected within the stepper, and the actual image formed on the wafer while in the stepper. Precise alignment between the succeeding layers formed on the wafer is critical for several reasons. For example, precise alignment is necessary to accurately couple interconnects, to ensure proper location of insulators, and to accurately shape and size devices for proper performance. The alignment system used in a stepper can cause a linear off-set, or translational misalignment in the X and Y direction, for a Cartesian-coordinate based system. Hence, a need arises for ensuring accurate translational alignment of multiple layers formed on a wafer.

Each one of the error-causing variables can be corrected by a different part of the stepper. If errors are not segregated and measured independently, then the error measurements are confounded, and the resulting corrections for each variable may be contradictory and self-defeating. Thus, a need arises for a method to segregate other error-causing variables from the translational misalignment variable to yield a true translational misalignment measurement.

Referring now to prior art FIG. 1B, a top view of a conventional alignment reticle is shown. Alignment reticle 126 includes a first overlay box 130a, a second overlay box 130b, both located at the center portion of the reticle 126, and a fine alignment target 132 located at an outer portion of the alignment reticle 100b. Hence, the fine alignment target is located a significant distance, 136 and 138, away from small overlay box 130a and large overlay box 130b. Large overlay box 130b is offset from small overlay box 130a by a distance 140. Alignment reticle 126 of prior art FIG. 1B is shown in a side view in prior art FIG. 1A.

The conventional alignment reticle and alignment process is corrupted by including errors other than translation misalignment errors in the process. The conventional process creates an alignment target at an outer location of the reticle image, 132 of prior art FIG. 1B and 126b of prior art FIG. 1A, that is projected through an outer portion 128b of the lens 128 of prior art FIG. 1A. Consequently, the alignment target created on the wafer suffers from lens distortion. Lens distortion typically increases towards the outer regions of the lens, due to factors such as lens irregularities and to properties of light. Additionally, the alignment target created on the wafer suffers from reticle writing error because it located a significant distance, e.g. 136 and 138 of prior art FIG. 1B, away from the overlay boxes, e.g. 130a and 130b, used to measure the misalignment of the stepper. That is, reticle writing error can have an error rate, linear or exponential, that accumulates over the distance between two images on the reticle. Hence, if an overlay box is located far away from an alignment target, then the prior art misalignment check will be measuring the translational misalignment of the reticle along with the translational misalignment of the stepper.

Furthermore, a long distance between the overlay boxes and the alignment targets only serves to amplify any processing error for the steps used in the alignment process, e.g. offset-measurement error. For example, if the wafer is realigned in the stepper using a charge coupled device (CCD) and digital signal processing pattern matching with a given tolerance, then this tolerance may be amplified at a location far from the alignment target. In one instance, a given rotational error at the alignment will increase with the distance, or radius, from the alignment target. This scenario is shown in the following figure, prior art FIG. 1C. Consequently, a need arises for creating an error-free alignment target. More specifically, a need arises for creating an alignment target without reticle writing error, offset-measurement error, and lens distortion error.

Referring now to prior art FIG. 1C, an example of a preventative maintenance wafer with overlay boxes created therein is shown. One shot 150 on a wafer is shown in this figure. Shot 150 has a small alignment box 160a and a large alignment box 160b, and a fine alignment target 162 formed therein. Alignment reticle 126 of prior art FIG. 1B is used to create the overlay boxes on the wafer 150. However, in this example, a misalignment other than translational error occurs when the stepper did not accurately align to fine alignment target 162, for the process that formed the second overlay box 160b on wafer 150. Even though the rotational error during alignment was a small angle 164, the large distance 166 between fine alignment target 162 and overlay box 160a magnifies the error to a substantial X error 162 and Y error 164. Hence, rather than correcting the small error in rotation, the prior art may attempt to correct the stepper with a misalignment correction in the X direction of 162 and a misalignment correction in the Y direction of 164. Consequently, the prior art alignment reticle and misalignment measurement process may actually overcorrect the stepper and possibly cause more error than originally existed.

The confounding of errors in the prior art translational misalignment measurement process becomes important when considering budget overlay requirements. Budget overlay is a value associated with the allowable tolerance for manufacturing a given size of photolithography imprint. For example, a 0.2 micron technology would typically have a 0.08 micron budget overlay. However, as demand increases for smaller and smaller images, the budget overlay must decrease as well. For example, the current 0.12 micron technology only allows approximately a 0.055 micron budget overlay. Consequently, as budget overlay decreases, the error in the misalignment measurement becomes more significant. Thus, a need for improving the accuracy of the translational misalignment measurement arises in light of more stringent budget overlay requirements.

In summary, a need arises for ensuring accurate alignment of multiple layers formed on a wafer. More specifically, a need arises for ensuring accurate translational alignment of multiple layers formed on a wafer. Consequently, a need arises for a method to segregate other error-causing variables from the translational misalignment variable to yield a true translational misalignment measurement. The need for improving the accuracy of the translational misalignment measurement arises in light of more stringent budget overlay requirements.

DISCLOSURE OF THE INVENTION

The present invention provides a method and an apparatus for ensuring accurate alignment of multiple layers formed on a wafer. More specifically, the present invention provides a method for ensuring accurate translational alignment of multiple layers formed on a wafer. That is, the present invention provides a method and an apparatus that segregates other error-causing variables from the translational misalignment variable to yield a true translational misalignment measurement. Thus the present invention improves the accuracy of the translational misalignment measurement to satiate more stringent budget overlay requirements.

In one embodiment, the present invention recites a method for determining translational misalignment error in a stepper. In one embodiment, the method comprises a series of steps in a stepper, starting with the step of receiving a wafer in the stepper. In another step a first pattern that includes an error-free fine alignment target, is created on the wafer. Next, the wafer is realigned in the stepper using the error-free fine alignment target. Then a second pattern is created on the wafer overlaying said first pattern. In another step, the translational error between the first pattern and the second pattern is measured.

In another embodiment, the present invention recites a stepper including a processor and a computer readable memory. The memory contains program instructions that, when executed via the processor, implement the aforementioned method for determining translation error in a stepper.

These and other objects and advantages of the present invention will no doubt become obvious to those of ordinary skill in the art after having read the following detailed description of the preferred embodiments illustrated in the various drawing figures.

BRIEF DESCRIPTION OF THE DRAWINGS

The accompanying drawings, which are incorporated in and form part of this specification, illustrate embodiments of the invention and, together with the description, serve to explain the principles of the invention:

PRIOR ART FIG. 1A is a side view of a conventional stepper is shown.

PRIOR ART FIG. 1B is a top view of a conventional alignment reticle is shown.

PRIOR ART FIG. 1C is a preventative maintenance wafer with overlay boxes created therein.

The drawings referred to in this description should be understood as not being drawn to scale except as specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention can be practiced without these specific details. In other instances, well-known methods, procedures, components, and materials have not been described in detail so as not to unnecessarily obscure aspects of the present invention.

Some portions of the detailed descriptions which follow, e.g. the processes, are presented in terms of procedures, logic blocks, processing, and other symbolic representations of operations for fabricating patterned layers, e.g. ICs, on a wafer. These descriptions and representations are the means used by those skilled in the art of wafer fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of applying material, removing material, or changing the state or structure of a material on a wafer by chemical, optical, and mechanical means.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, terms such as or "receiving," "creating," "aligning," "measuring," "exposing," "projecting," "compensating," or the like, refer to the action and processes of fabricating material and patterns on a wafer.

Figure 2A:
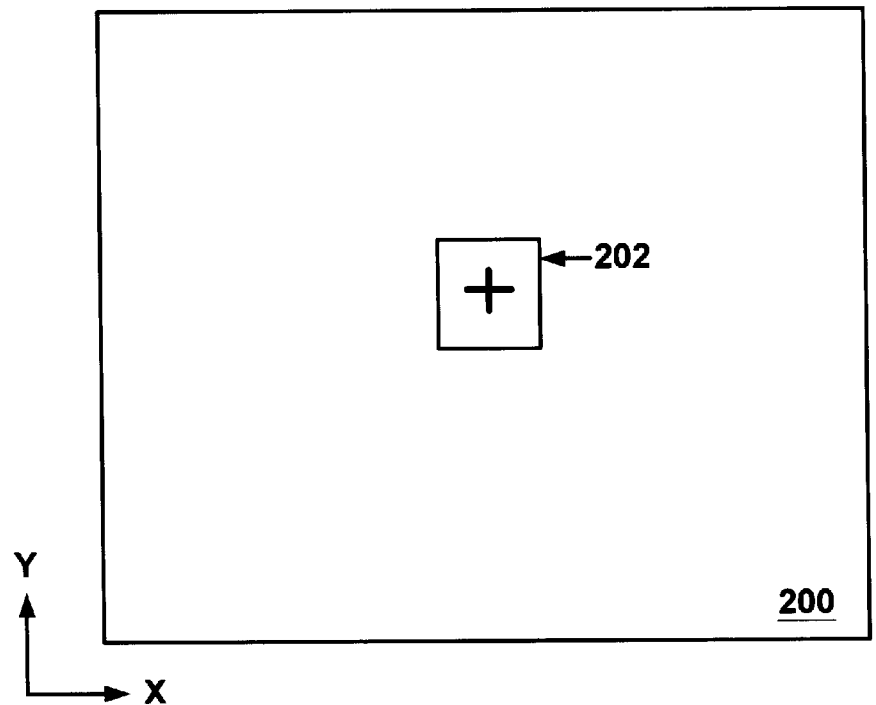
FIG. 2A is a top view of an alignment reticle, in accordance with one embodiment of the present invention.

Referring now to FIG. 2A, an alignment reticle is shown, in accordance with one embodiment of the present invention. FIG. 2A shows alignment reticle 200 in a top view. Alignment reticle 200 includes a center portion 202. While the present embodiment shows only center portion 202, the present invention is suitable to an alignment reticle having other patterned features outside of center portion 202. Center portion includes a first pattern, having a fine alignment target, and a second pattern, both not shown in FIG. 2A. By locating the fine alignment target in the center portion 202 of alignment reticle 200, the present invention can more accurately locate to the fine alignment target during the translational misalignment measurement process. More specifically, the present invention eliminates other sources of error, such as lens distortion, reticle writing error, and rotational misalignment from the translational misalignment measurement by locating the fine alignment target, in the center of the reticle, close to the overlay boxes.

Figure 2B:
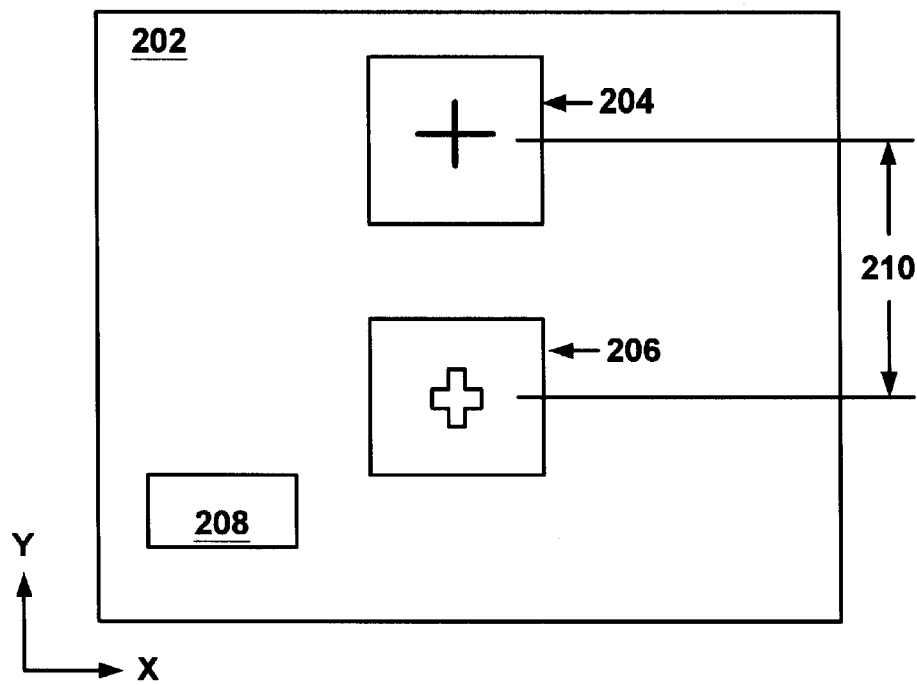
FIG. 2B is a top view of a first configuration for a center portion of an alignment reticle, in accordance with one embodiment of the present invention.

Referring now to FIG. 2B, a first configuration of a center portion of an alignment reticle is shown, in accordance with one embodiment of the present invention. In FIG. 2B, center portion 202 of alignment reticle 200 includes a first pattern and a second pattern. In the present embodiment, first pattern includes a large overlay box 204 and a fine alignment target 208. Second pattern includes a small overlay box 206. Large overlay box 204 is offset from small overlay box 206 by distance 210. This distance can vary depending upon the application. While the present embodiment shows specific location and dimensions for large overlay box 204, small overlay box 206, and fine alignment target 208, the present invention is suitable to a wide variety of sizes and locations for these components within center portion 202 of reticle 200. The present embodiment shows large overlay box 204 as white, and small overlay box 206 as dark for photosensitivity purposes. However, the present embodiment is suitable to switching the photosensitive configurations of the overlay boxes. The following figure provides an alternative embodiment.

Figure 2C:
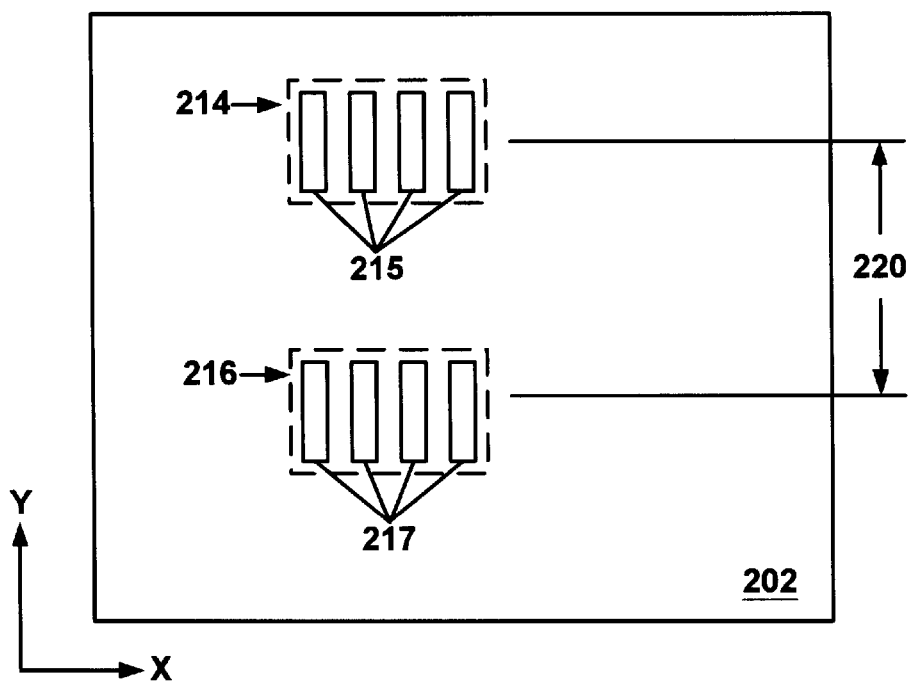
FIG. 2C is a top view of a second configuration for a center portion of an alignment reticle, in accordance with one embodiment of the present invention.

Referring now to FIG. 2C a second configuration of a center portion of an alignment reticle is shown, in accordance with one embodiment of the present invention. In FIG. 2C, center portion 202 includes a first pattern 214 and a second pattern 216. In the present embodiment, first pattern 214 includes multiple large overlay boxes 215. Similarly, second pattern 216 of the present embodiment includes multiple small overlay boxes 217. Small overlay boxes 217 or large overlay boxes 215 can also be adapted for use as fine alignment targets for aligning the wafer in the stepper during the translational misalignment measurement. Consequently, this embodiment isolates the true translational misalignment error between the reticle and the wafer because one of the overlay boxes is the alignment target. Hence, there is no error arising from the separation distance between the fine alignment target and the overlay box. While the present embodiment shows three of each kind of overlay box, e.g. 215 and 217, the present invention is well-suited to using any quantity of small overlay boxes for fine alignment targets, or to using any quantity of large overlay boxes for fine alignment targets. The present invention is well-suited to a wide variety of sizes and locations of overlay boxes within center portion of alignment reticle. Additionally, the present invention is also well-suited to adapting a center portion 202 of a product reticle for fine alignment target and overlay boxes. In this embodiment, the center portion of the reticle can be projected onto an area between dies, e.g. in the scribe line, on a product wafer. This alternative, applicable to a reticle covering more than one die, provides translation error measurement capabilities without interfering with the product wafer dies. The method and apparatus that uses fine alignment target for overlay box is described in greater detail in co-pending US patent application concurrently filed herewith, entitled "Method for Determining Wafer Misalignment Using a Pattern and an Alignment Mark," by Pierre Leroux, attorney docket number VLSI-3409 and assigned to the assignee of the present invention.

Figure 3A:
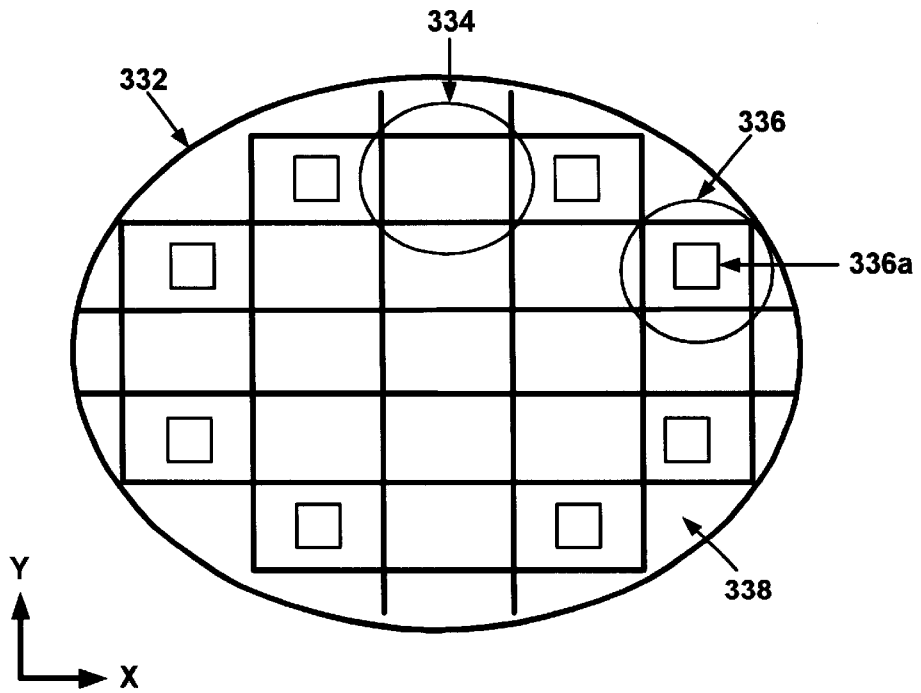
FIG. 3A is a top view of a wafer with several shots of an alignment image created therein, in accordance with one embodiment of the present invention.

Referring now to FIG. 3A, a top view of a wafer with an alignment image created therein is shown, in accordance with one embodiment of the present invention. Wafer 330 is sectioned into multiple peripheral shots, e.g. 336, into multiple internal shots, e.g. 334, and into cutoff areas, e.g. 338. Peripheral areas, e.g. 336, are uncropped shots, in the shape of a square, that touch the outside diameter 332 of wafer 330. Internal areas, e.g. 334, are uncropped shots, in the shape of a square, that do not touch outside diameter 332 of wafer 330. Cutoff areas 338 are areas that do not have a complete shot, or square shape, on wafer 330. Peripheral shots 336 have a center region, e.g. 336a, where a pattern from an alignment reticle is formed. While only the peripheral shots, e.g. 336, have a center region with a pattern in the present embodiment, the present invention is well-suited to forming a center region with a pattern on only one of the peripheral shots, or on any of the shots on wafer, e.g. an internal shot. Furthermore, the present invention is suitable to any shape of shots on a wafer.

Figure 3B:
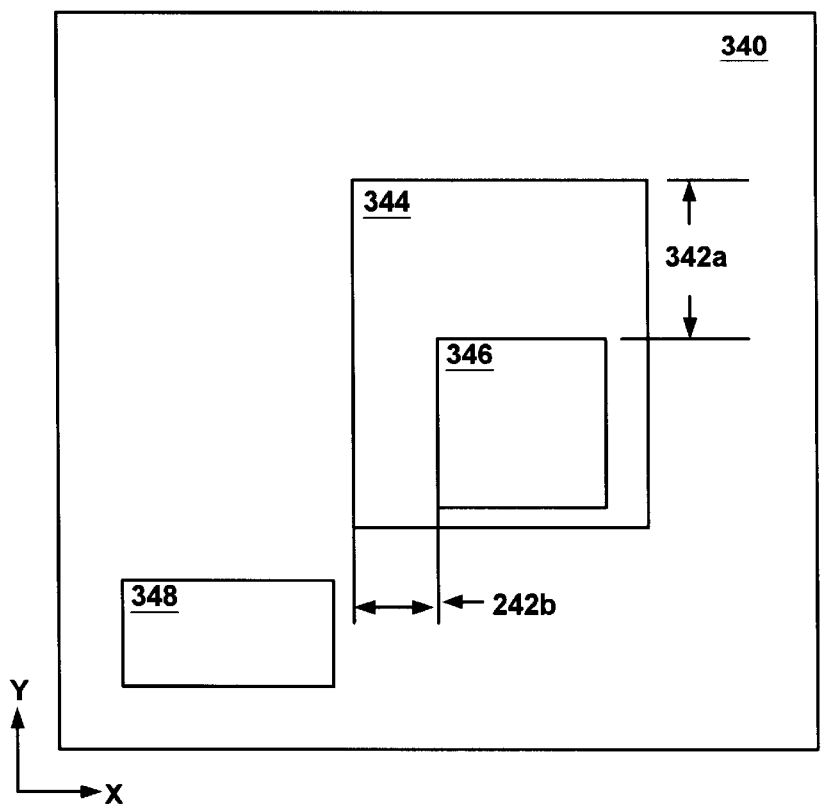
FIG. 3B is a top view of one shot on a wafer with alignment overlays, in accordance with one embodiment of the present invention.

Referring now to FIG. 3B, a shot on a wafer with alignment overlays is shown, in accordance with one embodiment of the present invention. FIG. 3B shows the top view of shot 336a. Shot 336a includes a large overlay box 344, a small overlay box 346, and a fine alignment target 348. The overlay configuration on a wafer corresponds to the alignment reticle shown in FIG. 2B. In the present embodiment, large overlay box 344 encompasses small overlay box 346. However the present embodiment is well-suited to having any position of large overlay box and small overlay box. Furthermore, while the present embodiment utilizes a fine alignment target 348 that is an individual entity from overlay boxes 344 and 346, the present invention is well-suited to having one or more of the overlay boxes function as the fine alignment target. This latter embodiment corresponds to the alignment reticle of FIG. 2C.

Figure 3C:
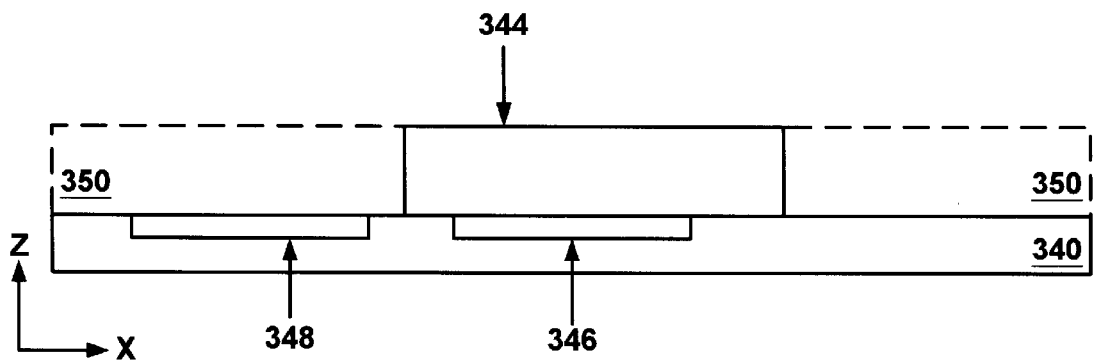
FIG. 3C is a side view of one shot on a wafer with alignment overlays, in accordance with one embodiment of the present invention.

Referring now to FIG. 3C, a shot on a wafer with alignment overlays is shown, in accordance with one embodiment of the present invention. FIG. 3C essentially shows a side view of the shot shown in FIG. 3B. Large overlay box 344 is formed from a pre-existing layer of photoresist 350, where regions, shown as dashed lines outside of large overlay box 344, are etched away. However, small overlay box 346 and fine alignment target 348 are formed in the durable silicon substrate 340. In this manner, small overlay box 346 and fine alignment target 348 are preserved for multiple translational misalignment measurement. That is, large overlay box 344 can be repeatedly formed in a photoresist layer, then etched away for a subsequent translational misalignment measurements using the existing small overlay box 346 and fine alignment target 348. The present invention is suitable to switching which overlay box is formed in silicon and which is formed in the photo-resist layer. The present invention is also well-suited to using alternative materials in which large overlay box 344, small overlay box 346, and fine alignment target 348 may be formed. For example, one overlay box can be formed in a metal layer located on top of silicon wafer, and another overlay box can be formed in some other layer formed above metal layer. The present embodiment utilizes only silicon and photoresist layers to preserve the geometric and structural integrity of the wafer. That is, the present embodiment prevents warping and distortion that may otherwise arise from using other types of material layers and layering processes.

Figure 4:
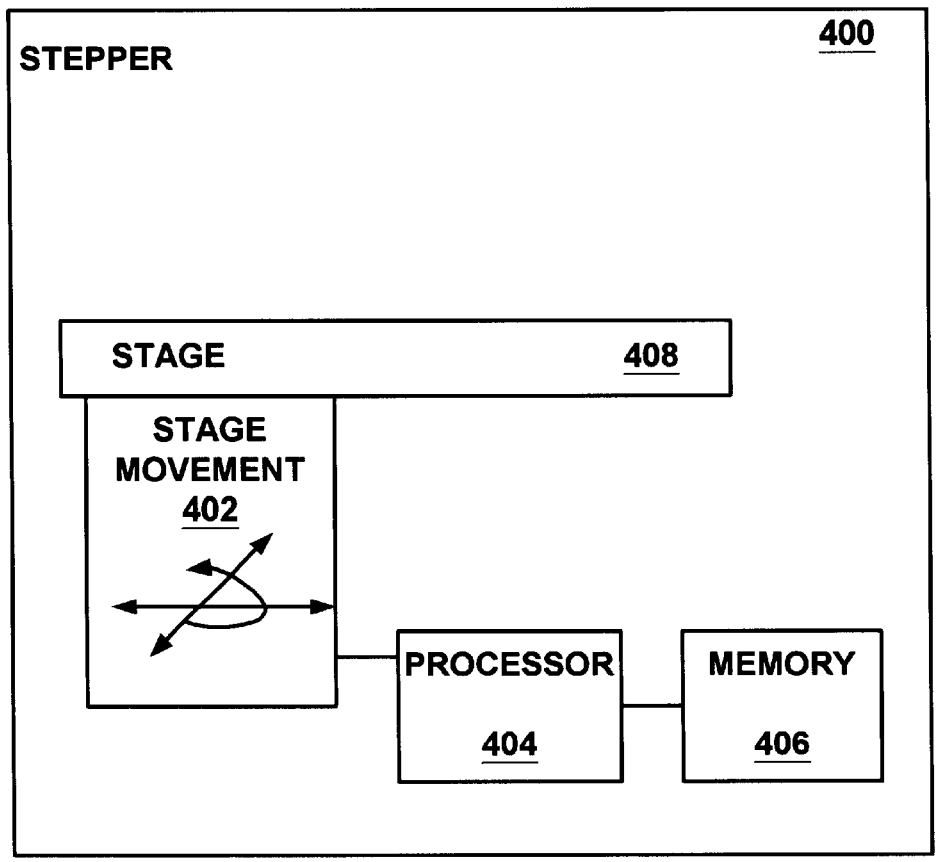
FIG. 4 is a stepper having the improved translation error measurement procedure, in accordance with one embodiment of the present invention.

Referring now to FIG. 4, a stepper using the improved translation error measurement procedure, in accordance with one embodiment of the present invention. Stepper 400 includes a stage 408 coupled to a stage movement device 402, a processor, and a memory 406. Memory 406 contains program instructions that, when implemented through processor 404, allow stepper 400 to implement the steps used in the present invention to measure the translation portion of a misalignment error between two patterns on a wafer.

Figure 5:
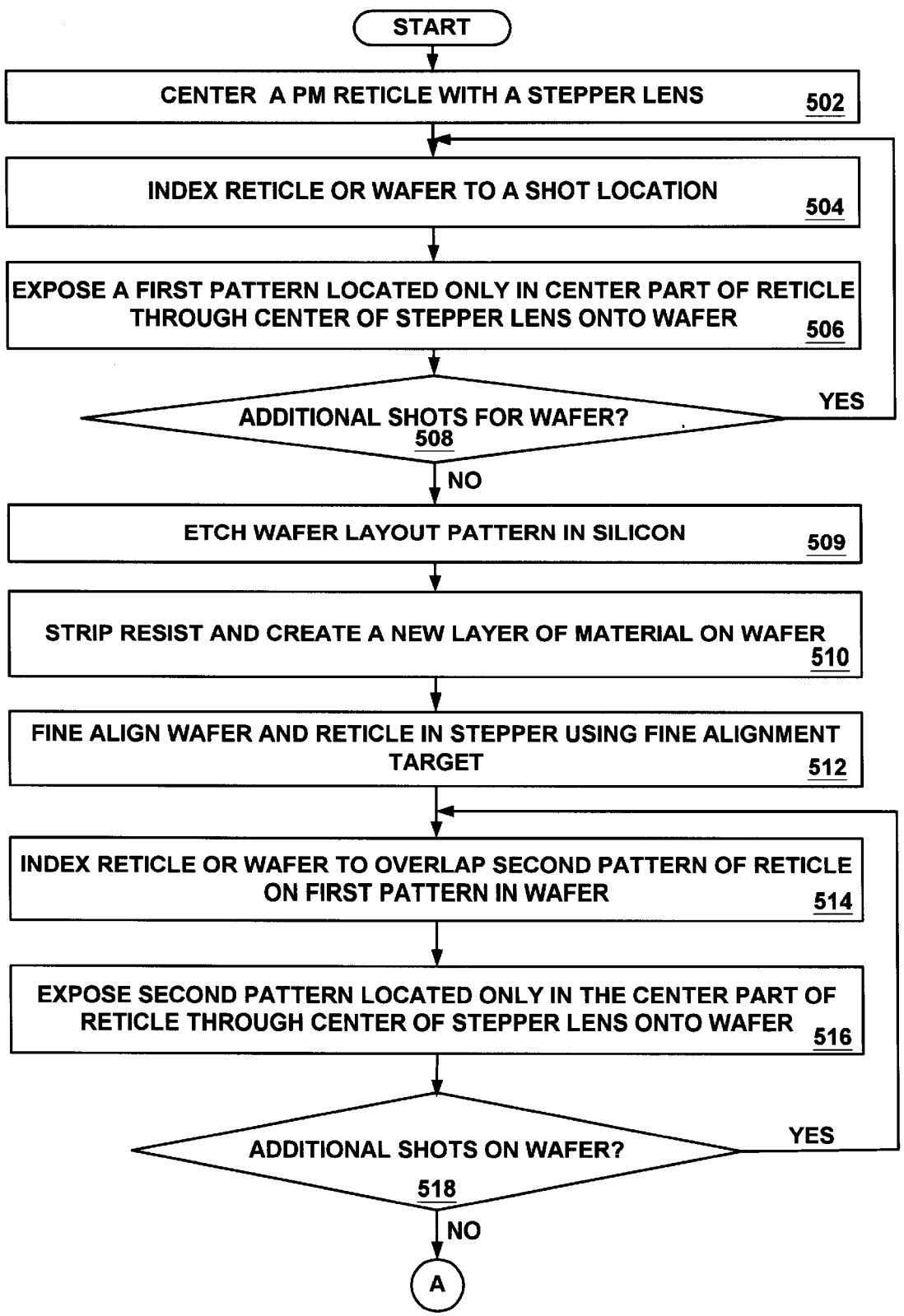
FIG. 5 is a flowchart of the steps performed to measure the translation portion of a misalignment error, in accordance with one embodiment of the present invention.
Figure 5:
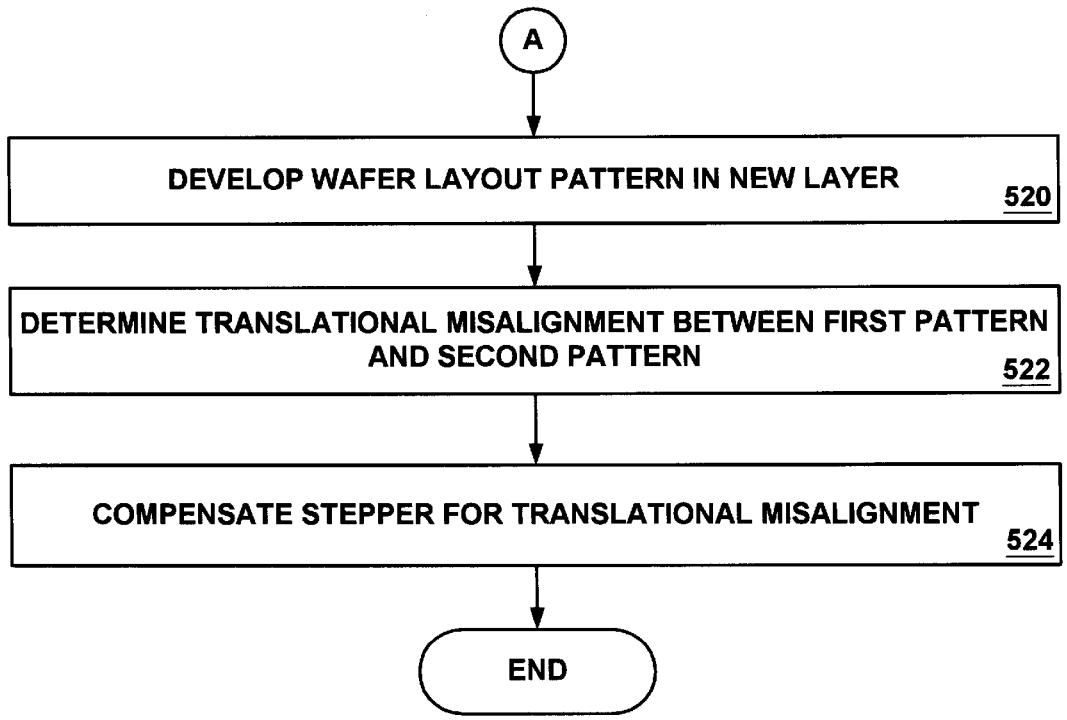

Referring now to FIG. 5, a flowchart of the steps performed to measure the translation portion of a misalignment error between two patterns for a stepper machine is shown, in accordance with one embodiment of the present invention. By using the flowchart embodiment, the present invention provides a very accurate measurement of only the translational misalignment error between a reticle and a wafer in a stepper. Consequently, the present invention provides better resolution, accuracy, and ultimately yield, of layers and patterns formed on a wafer. While the present invention utilizes flowchart 500 in a stepper machine, the present invention is well-suited to adapting the method of the present invention in any device needing wafer alignment.

In step 502 of the present embodiment, a preventative maintenance (PM) reticle is centered with a stepper lens in a stepper. FIGS. 2A through 2C show several embodiments of a PM reticle that can be used in step 302. The present invention is well-suited to using any type of PM reticle or even a product-wafer reticle having patterns suitable for translation misalignment measurement. Following step 502, flowchart 500 proceeds to step 504.

In step 504 of the present embodiment, the reticle or wafer is indexed to a shot location on the wafer. A shot is referred to as the image to be projected onto a wafer. In most cases, the shot can be equivalent to a die size of a product wafer, but in some cases, a shot can cover several dies. In one embodiment, a stage moves the wafer such that the shot may be placed on different areas of the wafer from the reticle. In another embodiment, the reticle and lens are indexed to accomplish this goal. Indexing is used to compensate for the offset 210 between small overlay box 204 and large overlay box 206, as shown in FIG. 2B, as one embodiment. If step 504 is implemented as a result of an affirmative response from step 508, then step 504 indexes the reticle or wafer to a new shot location. Following step 504, flowchart 500 proceeds to step 506.

In step 506 of the present embodiment, a first pattern located in the center portion of the reticle is exposed through a center portion of a stepper lens onto a wafer. FIGS. 2A through 2C show several embodiments of patterns used in step 506. FIG. 2A shows a center portion 202 of an alignment reticle 200. The center portion of the reticle is presented as other embodiments, and in greater detail, in FIGS. 2B and 2C. FIGS. 2B and 2C show first pattern as a small alignment box 204 and 214, respectively. FIG. 2C uses a first pattern that is also adapted to function as a fine alignment target. In contrast, FIG. 2B uses a first pattern that includes a small overlay box 204, independent of the fine alignment target 208. While the present embodiment shows specific size and shape of first pattern, the present invention is well-suited to using any size, shape, or location of first pattern that satisfies the steps of flowchart 500.

While the prior art uses patterns in outer portion 126b of reticle 126 for translation misalignment, the present invention limits the first pattern only to the center portion 202 of reticle 200. By using a pattern only in the center of the reticle, the translational misalignment error is not confounded, or intermixed, with other sources of errors. Because each type of error is individually correctable on the stepper, each error should be isolated and measured independent of the other errors. By doing this, a product design reticle can be more accurately produced in the stepper, and thus increase the yield of the product wafer. Likewise, the present embodiment projects the pattern through the center portion of the stepper lens. This prevents lens-aberration error from confounding the translational misalignment measurement. The prior art uses an outer region 128b of stepper lens 128, as shown in prior art FIG. 1A, and thus, suffers from lens aberration errors in the translation misalignment measurement. This is because the lens distortion errors are usually greater at any location on the lens other than the center of the lens. In contrast, the present invention uses only the center portion of the lens for creating patterns used for the translation misalignment measurement. Following step 506, flowchart 500 proceeds to step 508.

In step 508 of the present embodiment, a query determines whether additional shots are desired for the wafer. In one embodiment, only one shot location is used for the translational misalignment measurement. However, the present invention is well-suited to any quantity of shots on a wafer. For example, FIG. 3A presents one embodiment where a shot, e.g. 336a, is used in each of the eight peripheral shot locations, e.g. 336. Typically, the more shots used for the translational misalignment measurement, the more accurate the results. If additional shots are desired for the wafer, flowchart 500 returns to step 504. If additional shots are not desired for the wafer, then flowchart 500 proceeds to step 509.

In step 509 of the present embodiment, the wafer layout pattern is etched in the silicon wafer. In the present embodiment, the wafer layout pattern etched in the silicon wafer is the first pattern. Several embodiments of the first pattern are discussed in step 506. The present embodiment forms the first pattern in the silicon wafer because silicon is very stable and rigid. Also, by using the substrate silicon instead of an additional layer on top of the silicon, avoids the problem of distortion and warpage caused by a layer, e.g. metal, deposited on top of the silicon. However, the present invention is suitable to using a wide variety of materials for the wafer and for a layer in which the first pattern can be etched. FIGS. 3B and 3C shows one embodiment of step 510 where small overlay box 346 and fine alignment target 348 are etched into silicon substrate 340. Following step 509, flowchart 500 proceeds to step 510.

In step 510 of the present embodiment, the resist is stripped and a new layer of material is created on the wafer.

The resist of the present step is used to mask the silicon substrate to form the pattern of step 509. By striping the resist, the new layer of material can be deposited directly on the silicon substrate. In one embodiment, the new layer is a photo-resist layer. While the present invention specifies the type of materials and sequence of layers, the present invention is well-suited to using quantities of layers and materials, other than those of the present embodiment, that are well-known in the art. FIG. 3C shows one embodiment of step 510 where new layer 350, shown in dashed lines, is created on the wafer. Following step 510, flowchart 500 proceeds to step 512.

In step 512 of the present embodiment, the wafer is fine aligned, in the stepper, to the reticle using the fine align targets. The fine align targets used in the present embodiment are those formed from the center of the alignment reticle and projected through the center portion of the stepper lens. In this manner, the wafer may be precisely aligned for the translation misalignment measurement. In one embodiment, e.g. shown in FIG. 2C, the fine alignment targets is actually the first overlay box. Consequently, the present invention essentially achieves a pure transitional misalignment error without confounding from other types of errors. Following step 512, flowchart 500 proceeds to step 514.

In step 514 of the present embodiment, the reticle or wafer is indexed to overlap second pattern of reticle on first pattern in wafer. Because the present embodiment uses the same reticle for both sets of overlay boxes, the reticle, or the wafer, must be indexed to align the new pattern, e.g. the second pattern, with the original pattern in the wafer, e.g. the first pattern. FIGS. 2B and 2C illustrate the index feature where large overlay box 204 and 214, respectively, are offset by amounts 210 and 220, respectively, from small overlay boxes 206 and 216, respectively. Offsets 210 and 220, and index distances, used in step 514, are respectively compatible with each other. However, they can vary, parallelly, according to the application. Following step 514, flowchart 500 proceeds to step 516.

In step 516 of the present embodiment, a second pattern, located in the center portion of the reticle, is exposed through the center of the stepper lends onto the wafer. FIGS. 2A through 2C show several embodiments of step 516. FIG. 2A shows center portion 202 of alignment reticle 200. Center portion 202 of the reticle 200 is presented in greater detail in FIGS. 2B and 2C, as other embodiments. FIGS. 2B and 2C show second pattern as a large alignment box 206 and 216, respectively. FIG. 2C uses a second pattern that can also be adapted to function as a fine alignment target. In contrast, FIG. 2B uses a second pattern that includes a large overlay box 206, independent of the fine alignment target 208. While the present embodiment shows specific size and shape of second pattern, the present invention is well-suited to using any size, shape, or location of second pattern that satisfies the steps of flowchart 500.

While the prior art uses patterns in outer portion 126b of reticle 126 for translational misalignment, the present invention uses the second pattern only to the center portion 202 of reticle 200. By using a pattern in the center of the reticle, the translational misalignment error is not confounded, or intermixed, with other sources of errors. Because each type of error is individually correctable on the stepper, each error should be isolated and measured independent of the other errors. By doing this, a product design reticle can be more accurately produced in the stepper, and thus increase the yield of the product wafer. Likewise, the present embodiment projects the pattern through the center portion of the stepper lens. This prevents lens-aberration error from confounding the translational misalignment measurement. The prior art uses an outer region 128b of stepper lens 128, as shown in prior art FIG. 1A, and thus, suffers from lens aberration errors in the translation misalignment measurement. This is because the lens distortion errors are usually greater at any location on the lens other than the center of the lens. In contrast, the present invention uses only the center portion of the lens for creating patterns used for the translation misalignment measurement. Following step 516, flowchart 500 proceeds to step 518.

In step 518 of the present embodiment, a query determines whether additional shots are desired for the wafer. This step essentially parallels the inquiry in step 306. If additional shots are needed, then flowchart 500 returns to step 514. If no additional shots are needed, then flowchart 500 proceeds to step 520.

In step 520 of the present embodiment, the wafer layout pattern is etched in the new layer. In the present embodiment, the wafer layout pattern refers to the second pattern. FIGS. 3B and 3C shows one embodiment of step 520 where large overlay box 344 is etched into new layer 350. By etching the second pattern into the new material, only the pattern remains, and the balance of the new material is removed, as indicated by the dashed lines in FIG. 3C. Following step 520, flowchart 500 proceeds to step 522.

In step 522 of the present embodiment, the translational misalignment between the first and second pattern is determined. In one embodiment, an overlay tool is utilized to determine the offset between the two patterns. Step 522 is shown, in one embodiment, in FIG. 3B where an offset in X-direction 342b and an offset in the Y direction 342a indicate the translational misalignment, after accounting for the difference in large to small overlay box sizes, between the reticle and the wafer in the stepper. In one embodiment, where numerous shots are made of the first and second pattern, e.g. as shown in FIG. 3A, the translational misalignment measurement can be determined using various averaging or weighting methods, depending upon the application and desired result. In one embodiment, if no translational error exists between the reticle and the wafer in the stepper, large overlay box 344 would have an equal gap around all four sides to small overlay box 346. In another embodiment, a nominal offset can intentionally be generated between the overlay boxes. In that case, the translational misalignment measurement would consider the nominal offsets used. Following step 522, flowchart 500 proceeds to step 524.

In step 524 of the present embodiment, the stepper is compensated for the translation portion of the misalignment error, measured in the previous step, with a software adjustment. By using software, the mechanical portion of the machine does not need to be adjusted. Also, by implementing the correction on the stepper, images can accurately be formed from the reticle to the wafer, thus increasing the yield of the product. Following step 522, flowchart 500 ends. The present embodiment allows the steps of flowchart 500 to be repeated using the same wafer.

While flowchart 500 of the present embodiment shows a specific sequence and quantity of steps, the present invention is suitable to alternative embodiments. For example, not all the steps provided for flowchart 500 are required for the present invention. And additional steps may be added to those presented. Likewise, the sequence of the steps can be modified depending upon the application.

In summary, the present invention provides an apparatus and a method for ensuring accurate alignment of multiple layers formed on a wafer. Additionally, the present invention improves the accuracy of the misalignment measurement for the stepper. That is, to measure, and compensate for, the true misalignment caused by the stepper, the present invention provides an alignment method that does not add additional errors beyond the true misalignment of the stepper. Furthermore, the present invention improves the accuracy of the misalignment measurement for the stepper. That is, to measure, and compensate for, the true misalignment caused by the stepper, the present invention provides an alignment method that does not add additional errors beyond the true misalignment of the stepper. Consequently, the present invention creates an error-free alignment target. More specifically, the present invention creates an alignment target without reticle writing error, offset-measurement error, and lens distortion error.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the claims appended hereto and their equivalents.

I claim:

1. In a stepper, a method of determining a translation portion of a misalignment error between a reticle image and a wafer, said method comprising the steps of:
    a) receiving said wafer in said stepper;
    b) creating a first pattern on said wafer, said first pattern including an error-free fine alignment target;
    c) aligning said wafer in said stepper using said error-free fine alignment target;
    d) creating a second pattern on said wafer, said second pattern overlaying said first pattern such that rotational alignment errors, lens distortion errors and reticle writing errors are minimized; and
    e) measuring said translational portion of said misalignment error between said first pattern and said second pattern.

2. The method recited in claim 1 wherein step b) includes the steps of:
    b1) exposing only a center portion of a reticle image, said reticle image containing said first pattern; and
    b2) projecting said center portion of said reticle image through a center portion of a stepper lens.

3. The method recited in claim 1 wherein step d) comprises the steps of:
    d1) exposing only a center portion of a reticle image, said reticle image containing said second pattern; and
    d2) projecting said center portion of said reticle image through a center portion of a stepper lens.

4. The method recited in claim 1 wherein said first pattern includes a large overlay.

5. The method recited in claim 1 wherein said second pattern includes a small overlay.

6. The method recited in claim 1 wherein said second pattern is a large overlay adapted to be formed over said fine alignment target on said wafer.

7. The method recited in claim 6 wherein said step e) comprises the step of:
    e) measuring said translational error between said fine alignment target and said large overlay formed over said fine alignment target.

8. The method recited in claim 1 wherein said first pattern is created in a silicon portion of said wafer.

9. The method recited in claim 8 wherein said second pattern is formed in a resist layer located on top of said silicon portion of said wafer.

10. The method recited in claim 1 wherein said method further comprises the step of:
    f) compensating said stepper for said translation portion of said misalignment error with a software adjustment.

11. The method recited in claim 1 wherein said reticle image is a preventative maintenance (PM) reticle image.

12. The method recited in claim 1 wherein said first pattern and said second pattern includes a square shape.

* * * * *